United States Patent [19]

Snyder

[11] Patent Number: 5,420,711
[45] Date of Patent: May 30, 1995

[54] FIBER OPTIC LINK AMPLITUDE STABILIZATION CIRCUIT

[76] Inventor: Dan E. Snyder, 14508 Los Fuentes, La Mirada, Calif. 90638

[21] Appl. No.: 5,675

[22] Filed: Jan. 19, 1993

[51] Int. Cl.⁶ .................... H04B 10/12; H04B 10/04; H04B 10/06
[52] U.S. Cl. .................. 359/173; 359/195; 359/188
[58] Field of Search ............... 359/110, 153, 161, 173, 359/174, 177, 179, 180, 187, 194, 195

[56] References Cited

U.S. PATENT DOCUMENTS 5,210,633  5/1993  Trisno ................... 359/194

FOREIGN PATENT DOCUMENTS 0484064  5/1992  European Pat. Off. ............ 359/194
0207446  12/1982  Japan ........................... 359/194
0140939  7/1985  Japan ........................... 359/194
0116029  5/1987  Japan ........................... 359/194
0250228  10/1988  Japan ........................... 359/194
0222244  9/1990  Japan ........................... 359/194
5114887  5/1993  Japan ........................... 359/194

Primary Examiner—Leslie Pascal
Attorney, Agent, or Firm—W. K. Denson-Low

[57] ABSTRACT

An amplitude stabilization circuit for fiber optic links that holds the RF gain of the link constant despite optical parameter variations. A voltage variable attenuator which attenuates DC and RF equally is placed between the link photodetector and a load resistor. The voltage on the resistor is compared with a reference voltage, and the comparison result is an error signal used in a feedback loop to control the attenuation of the attenuator.

15 Claims, 4 Drawing Sheets

FIBER OPTIC LINK AMPLITUDE STABILIZATION CIRCUIT

BACKGROUND OF THE INVENTION

The invention is an electronic circuit that holds the gain of a fiber optic (FO) link constant despite optical parameter variations that would otherwise cause gain variations.

FO links are used to carry RF signals between two distant locations. An externally modulated fiber optic link 20 is shown in FIG. 1. Light is generated by the continuous wave (CW) laser 22 and injected into the input fiber waveguide 24. The light is carried to the fiber optic modulator 26, which acts as a gate and varies the power in accordance with the RF input voltage (RF SIGNAL IN). The modulated light is carried by the output fiber 28 to the photodetector 30, where it is detected. A bias circuit 32 applies a DC bias to the photodetector 30. The detection process converts the modulated light into a current proportional to the modulating voltage, as shown in FIG. 2.

FO links, especially externally modulated links, suffer from RF gain fluctuations which cause problems for certain high performance applications where stability is important. The fluctuations can arise from laser power variations or optical loss variations caused by connectors or fiber bending. For certain applications it is very important that the gain, i.e., the ratio of the output signal to the input signal, stay constant. The gain of the link 20 is sensitive to the laser power and to the optical losses in the link. However, the gain and the average detected optical power vary in direct proportion, and this may be used, in accordance with the invention, to keep the gain constant.

There has been some previous attempts to stabilize the gain by controlling a voltage variable attenuator with the average detected current, but the attenuator was strictly an RF type and the control signal was taken from the detector side. Such an arrangement is subject to drift and low accuracy due to attenuator control nonlinearities.

Others have proposed to use an average photodetector current as a reference in a feed forward, open loop gain control circuit. The disadvantage with such gain control circuits is that they can easily lose accuracy due to tolerances, temperature drifts and component aging.

It is therefore an object of this invention to provide a gain control circuit for a FO link that compensates for component temperature drifts, aging and nonlinearities.

A further object is to provide a gain control circuit for a FO link which provides a noise reduction function.

SUMMARY OF THE INVENTION

An amplitude stabilization circuit is disclosed for a fiber optic link comprising a fiber optic waveguide, a laser input light source, modulating means for modulating the input light with an information signal, typically an RF signal, and a photodetector responsive to the link output light to demodulate the output light and recover the modulating signal. The amplitude stabilization circuit includes a voltage variable attenuator connected between the photodetector and a load resistor to attenuate photodetector current flowing therethrough. In accordance with the invention, the attenuator is characterized in that both the demodulated information signal and the average photodetector current are attenuated equally.

The circuit further includes means for comparing the voltage developed across the load resistor to a reference voltage and providing an error signal in dependence on the comparison, and means for coupling the error signal to the attenuator. The error signal controls the attenuation of the attenuator so as to hold the average photodetector current through the load resistor constant, and thereby also hold the RF gain of the link constant. Thus, a closed feedback loop is formed around the attenuator and the comparing means.

In a preferred embodiment, the attenuator is an FET voltage variable attenuator, and the comparing means is an operational amplifier.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
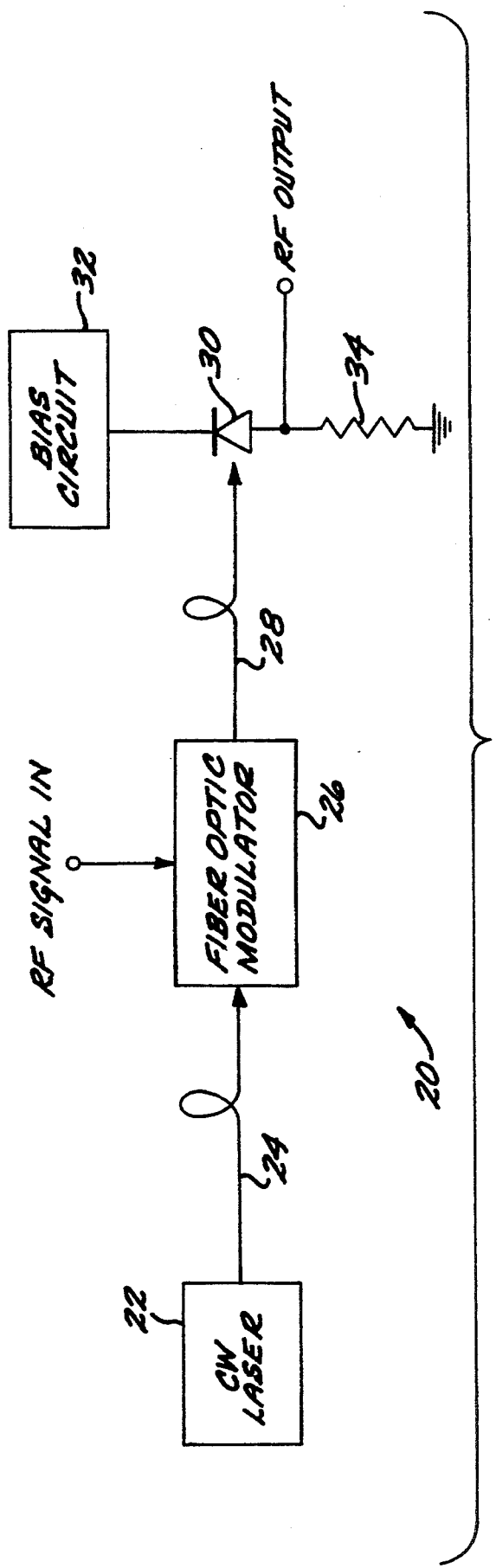
FIG. 1 is a simplified schematic diagram of a conventional externally modulated fiber optic link.
Figure 2:
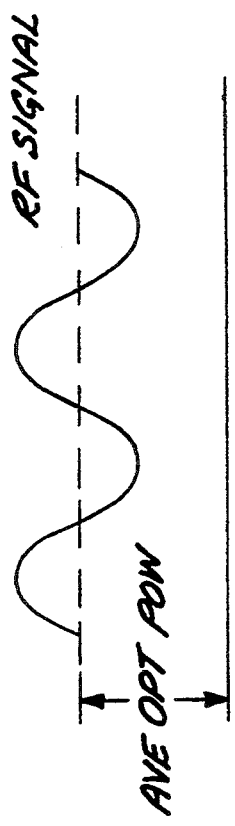
FIG. 2 is a graph of the detected photodetector current as a function of time.
Figure 3:
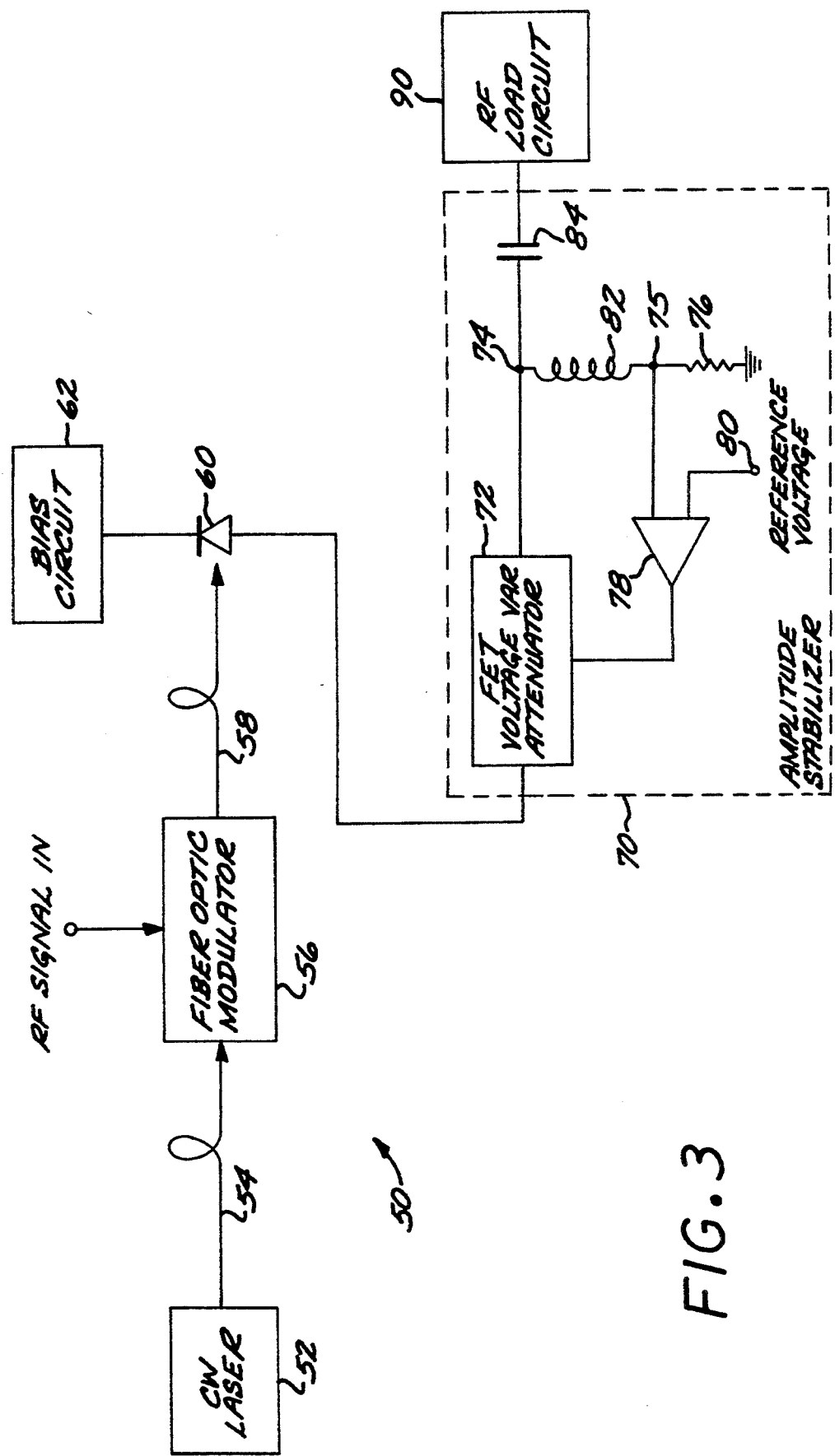
FIG. 3 is a simplified schematic diagram of a FO link gain control circuit in accordance with the invention.

FIG. 3 illustrates an externally modulated fiber optic link 50 generally similar to the FO link of FIG. 1, but employing an amplitude stabilizer circuit 70 in accordance with the invention. Thus, the link 50 includes a CW laser 52, an input optical fiber 54, a fiber optic modulator 56 which is modulated by an RF signal (RF SIGNAL IN), an output fiber 58, a photodetector 60 and a photodetector bias circuit 62. In accordance with the invention, the amplitude stabilizer circuit 70 is connected between the anode of the photodetector diode 60 and the RF output load circuit 90.

The amplitude stabilizer circuit 70 is implemented by placing a voltage variable attenuator 72 between the photodetector 60 and the RF load circuit 90, which in a typical application will be an RF amplifier having a 50 ohm characteristic impedance. The attenuator 72 has the characteristic that it attenuates equally RF and DC signals, i.e., the RF modulation signal and the average optical current. The fact that the average photodetector current and RF gain vary in direct proportion is well known. A breakthrough in this invention was the realization that adding feedback to such a VVA at DC would simultaneously hold the RF gain constant.

The circuit 70 further includes a feedback differential amplifier 78, which compares the voltage developed across a load resistor 76 at node 75 to a reference voltage, and develops an error signal which in turn controls the attenuation provided by attenuator 72. The reference voltage is selected to set the attenuation of the voltage variable attenuator 72 to a midrange value so there is sufficient range, both positive and negative, in attenuation to handle the expected range of gain changes to be stabilized. Because the RF signal and the average optical current are attenuated equally by the attenuator 72, the feedback amplifier 78 holds the average current constant at the load resistor 76, thereby also holding the RF gain of the link 50 constant.

The stabilization circuit 70 further includes an inductor 82 in series with the load resistor 76, and a capacitor 84 disposed between node 74 and the RF load circuit 90. The inductor value is selected to present a high impedance at the RF frequency band of interest. The capacitor value is selected to provide a low impedance at the RF frequency band of interest. The circuit elements 82 and 84, therefore, provide a means for separating the RF signal component and the average (i.e., DC) photodetector current at the VVA output, with the RF signal component going to the RF load circuit 90 and the DC component going to the load resistor 76. The value of the resistor 76 is selected to match the characteristic impedance of the RF load circuit 90, typically 50 ohms.

In FIG. 3, the current from the photodetector 58 consisting of the average detected current and the RF signal is applied to the input of the VVA 72. The attenuated RF and DC signals at the output of the VVA are separated by the capacitor 84 and inductor 82. The attenuated average photodetector current is converted into a voltage by the resistor 76 and compared to the fixed reference voltage by the amplifier 78. The error voltage at the output of the amplifier 78 drives the control input of the VVA 72 to complete the feedback loop. Any change in the input current causes an error signal which readjusts the attenuator 72 so as to hold the VVA output constant.

Attenuators suitable for the purpose of voltage variable attenuator 72 are commercially available, e.g., the model AT-307 or the model AT-250 available from M/A-COM ANZAC Operations, 80 Cambridge Street, Burlington, Mass. 01803. The model AT-307 has two control terminals, one controlling shunt FET attenuator devices, the other controlling series FET attenuator devices. In one exemplary circuit using this AT-307 device, the shunt control terminal was connected to a fixed voltage, and the series control terminal was connected to the error voltage from the amplifier 78. Such an arrangement provided sufficient attenuation range, in excess of 6 dB, for the application of interest for that exemplary circuit. The model AT-250 device has only a single control terminal, which is connected to the amplifier error signal output when the AT-250 output is employed in the circuit. Of course, other attenuator devices are available, and may be used, provided they have the characteristic that both RF and DC signals are equally attenuated, for the application in which the modulating signal is an RF signal.

Operational amplifiers suitable for the purpose of amplifier 78 are also commercially available. Preferably, the amplifier is a low drift operational amplifier. An exemplary device suitable for the purpose is the model LT 1001 precision operational amplifier marketed by Linear Technology Corporation, 1630 McCarthy Boulevard, Milpitas, Calif. 95035.

The bias circuit 62, as is well known in the art, is typically a DC power supply with a +10 volt level typical for most photodetectors. The particular bias voltage will be selected as appropriate for a given photodetector device.

Figure 4:
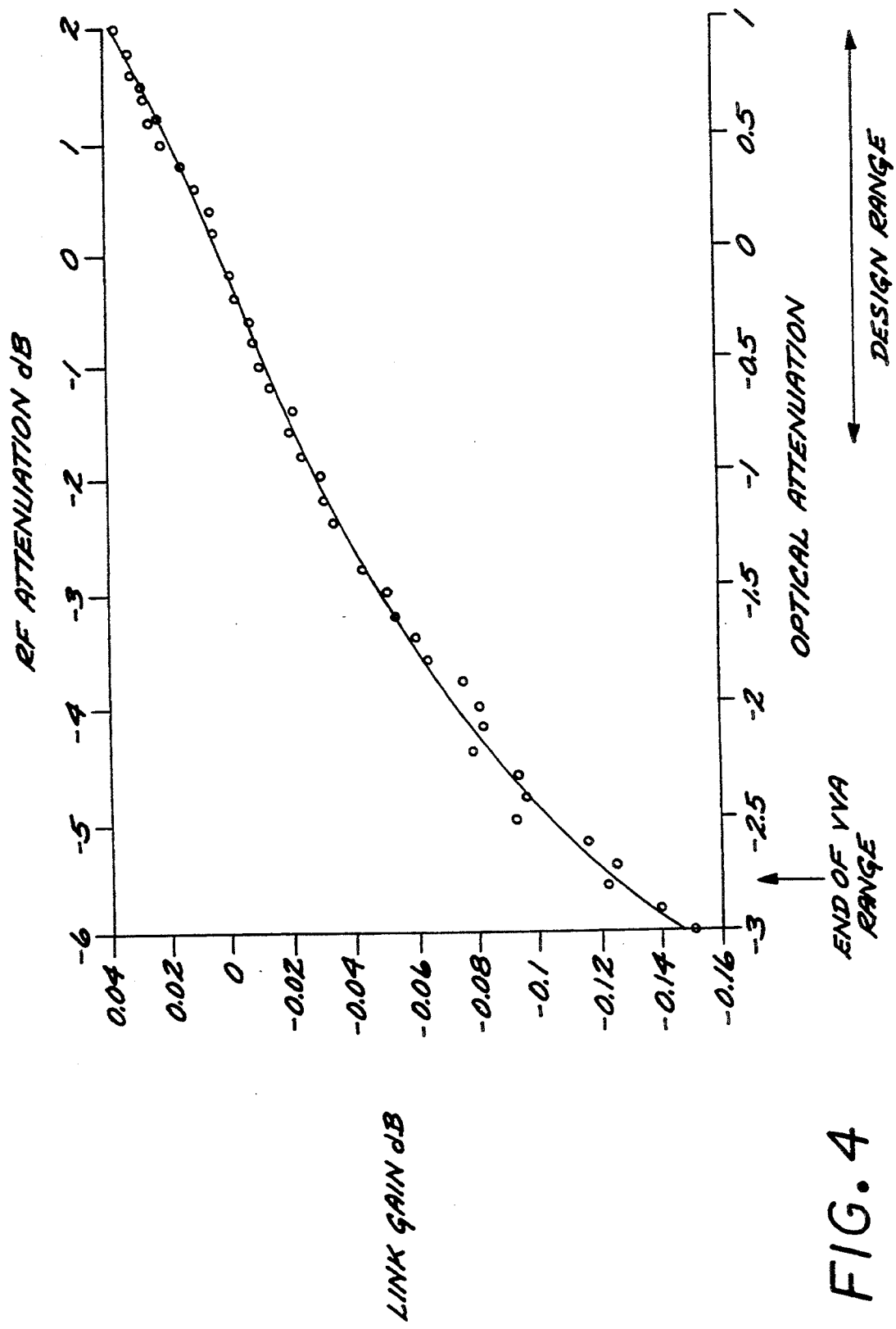
FIG. 4 depicts the measured link gain of a FO link including the invention while the input optical power is varied.
Figure 5:
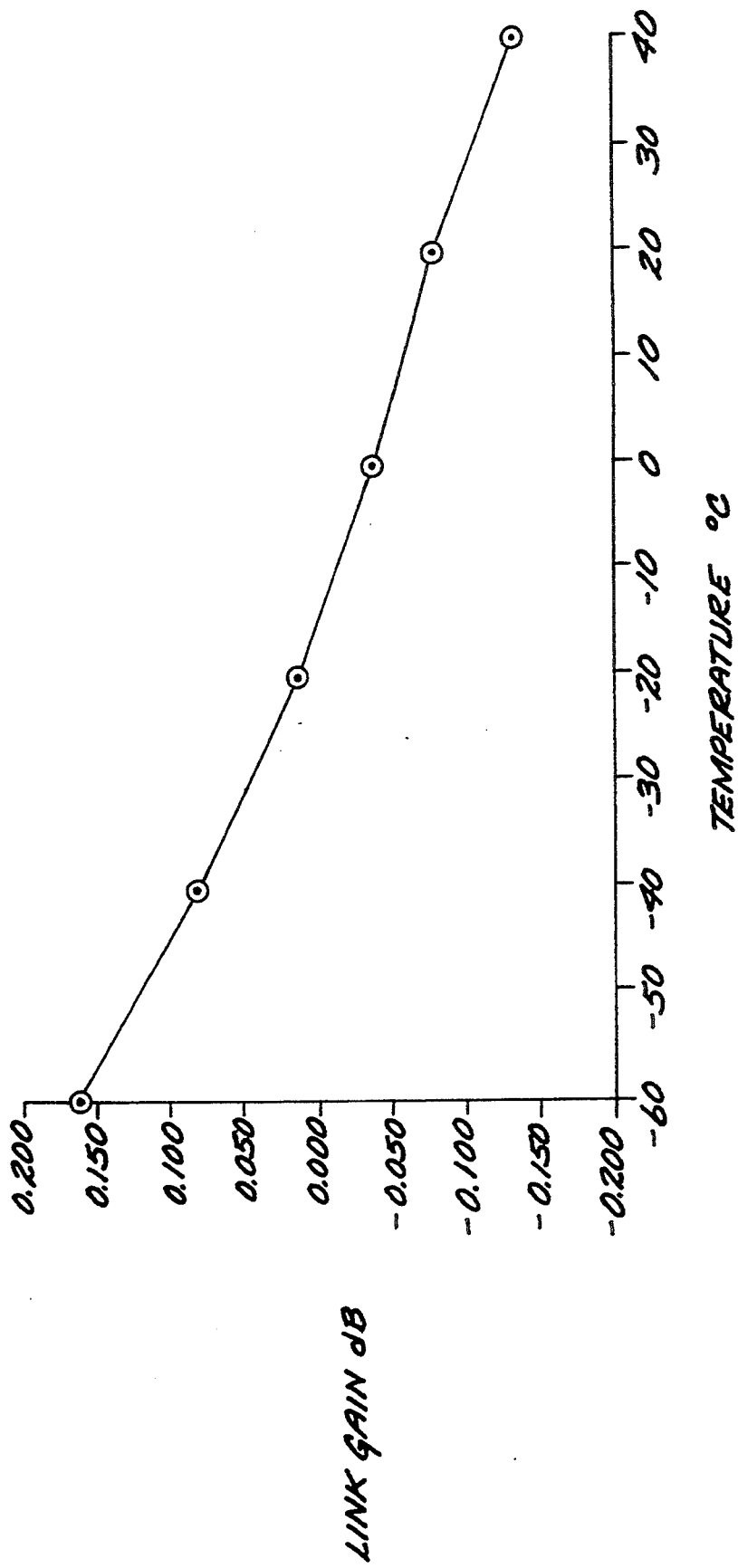
FIG. 5 illustrates the temperature stability of a gain control circuit embodying the invention.

FIGS. 4 and 5 show measured data on an exemplary amplitude stabilizer circuit embodying the invention. FIG. 4 verifies the functionality of the circuit. A variable optical attenuator was placed in the optical path of the FO link. Without the stabilizer, the RF gain will change 2 dB for every 1 dB of optical change. FIG. 4 shows that the stabilizer holds the RF gain constant to within 0.07 dB where there would normally be a 4 dB variation.

FIG. 5 demonstrates the stability advantage of the feedback approach. For a constant input, the temperature of the photodetector and stabilizer circuit was varied over a 100° C. range. The RF gain varied less than 0.3 dB over this entire range. While there is no data for comparison, an open loop stabilizer would be expected to have significantly more variation or require an elaborate temperature compensation scheme.

An added benefit of this invention is that the feedback circuit provides a noise reduction benefit. In an externally modulated link, the laser noise modulates the desired RF signal, increasing the noise level. This can be especially serious at small frequency offsets from the carrier frequency, e.g., 1 to 500 Hz. Because this noise also appears in the average photodetector current, it is effectively cancelled out by the amplitude stabilizer. Reduction of 10 to 15 dB has been measured on exemplary FO links embodying this invention.

The amplitude stabilizer circuit of the invention is also useful for directly modulated fiber optic links. In such a link, the RF signal directly modulates the laser current, thereby producing modulated light. In the directly modulated link, the gain does not change due to laser power variations, but it still changes due to optical loss variations. The amplitude stabilizer is effective against these latter variations.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. In a fiber optic link comprising a fiber optic waveguide, a source of input light modulated with an information signal, and photodetector means responsive to link output light to demodulate said output light, an amplitude stabilization circuit, comprising:
a variable attenuator connected between said photodetector means and a resistive loading means to attenuate photodetector current passing through said attenuator, said attenuator characterized in that both the demodulated information signal and the average photodetector current are attenuated equally; blocking means connected between said attenuator and said resistive loading means to block said demodulated information signal from passing to said resistive load while permitting said average photodetector current to pass to said resistive loading means;
means for comparing a voltage developed across said resistive loading means by said average photodetector current to a reference voltage and providing an error signal in dependence on said comparison; and
means for coupling said error signal to said attenuator to control the attenuation of said attenuator so as to hold the average photodetector current through said resistive loading means constant, and thereby also holding the gain of said link constant, whereby a closed feedback loop is formed around said attenuator and said comparing means.

2. The circuit of claim 1 wherein said information signal is an RF signal, and said circuit holds the RF gain of said circuit constant.

3. The circuit of claim 1 wherein said reference voltage is selected to set the attenuation of said attenuator to a midrange value of an attenuation range provided by said variable attenuator to provide sufficient range in attenuation to respond to the expected range of gain changes to be stabilized by said circuit.

4. The circuit of claim 2 wherein said blocking means comprises an inductor having a high impedance at RF frequencies.

5. The circuit of claim 1 wherein said attenuator comprises an FET voltage variable attenuator.

6. The circuit of claim 1 wherein said comparing means comprises an operational amplifier having a first input port connected to said resistive loading means and a second input connected to said reference voltage.

7. In a fiber optic link comprising a fiber optic waveguide, a source of input light modulated with an RF information signal, and photodetector means responsive to link output light to demodulate said output light, an amplitude stabilization circuit, comprising:
 a voltage variable attenuator connected between said photodetector means and a resistive loading element to attenuate photodetector current passing through said attenuator, said attenuator characterized in that both the demodulated RF information signal and the average photodetector current are attenuated equally;
 RF blocking means connected between said attenuator and said resistive loading element to block RF information signal components from passing to said resistive loading element while permitting said average photodetector current to pass to said resistive loading element, said RF blocking means comprising an inductor having high impedance at RF frequencies;
 means for comparing a voltage developed across said resistive loading element by said average photodetector current to a reference voltage and providing an error signal in dependence on said comparison; and
 means for coupling said error signal to said attenuator to control the attenuation of said attenuator so as to hold the average photodetector current through said resistive loading element constant, and thereby also holding the RF gain of said link constant,
whereby a closed feedback loop is formed around said attenuator and said comparing means.

8. A fiber optic link comprising:
 a source of input light modulated with an RF information signal;
 a fiber optic (FO) waveguide means having a first end and a second end, wherein said modulated input light is injected into said first end and traverses said FO waveguide means to said second end;
 photodetector means responsive to said light at said second end of said FO waveguide means to provide a photodetector current modulated by said information signal, said current characterized by an average photodetector current and an RF information signal component;
 an RF load circuit; and
 an amplitude stabilization circuit, comprising:

a variable attenuator means for attenuating said photodetector current at an attenuation level determined by a signal received at a control port, said attenuator means characterized in that both said average photodetector current and said RF information signal component are attenuated equally;
 a load resistor;
 separating means coupled to an output port of said variable attenuator means, to said RF load circuit and to said load resistor for separating said average photodetector current and said RF information signal component so that only said information signal component is passed to said RF load circuit and only said average photodetector current is passed to said load resistor; and
 attenuator feedback control loop means for setting the attenuation provided by said attenuator so as to hold the average photodetector current through said load resistor constant, and thereby also holding the RF gain of said link substantially constant.

9. The fiber optic link of claim 8 wherein said control loop comprises means for comparing the voltage developed across said load resistor to a reference voltage to provide an error signal indicative of the difference between said compared voltages, and means for connecting said error signal to said control port of said attenuator.

10. The fiber optic link of claim 9 wherein said comparing means comprises an operational amplifier.

11. The fiber optic link of claim 8 wherein said variable attenuator has an attenuation range, and said reference voltage is selected to set the attenuation of said attenuator to a midrange value within said attenuation range to provide sufficient range in attenuation to respond to the expected range of link gain changes to be stabilized by said circuit.

12. The fiber optic link of claim 8 wherein said attenuator comprises a voltage variable attenuator.

13. The fiber optic link of claim 8 wherein said source of input light comprises a laser source and a modulating means, said modulating means comprising a fiber optic modulator responsive to said RF information signal to modulate light emitted by said laser source.

14. A fiber optic link comprising:
 a source of modulated input light, said input light modulated by RF information signals;
 a fiber optic (FO) waveguide means having a first end and a second end, wherein said modulated input light is injected into said first end and traverses said FO waveguide means to said second end;
 photodetector means responsive to said light at said second end of said FO waveguide means to provide a photodetector current modulated by said information signal, said current characterized by an average photodetector current and an RF information signal component;
 an RF load circuit; and
 an amplitude stabilization circuit, comprising:
 a variable attenuator means including an input port and an output port for attenuating said photodetector current at an attenuation level determined by a signal received at a control port, said attenuator means characterized in that both said average photodetector current and said RF information signal component are attenuated equally, said photodetector current being received at said input port, and attenuated photodetector current is provided at said output port;

a load resistor;

separating means coupling said attenuator output port to said RF load circuit for separating said attenuated average photodetector current and said attenuated RF information signal component so that only said attenuated RF information signal component is passed to said RF load circuit and only said attenuated average photodetector current is passed to said load resistor, said separating means comprising an inductor disposed between said attenuator and said load resistor to block said attenuated RF information signal component from being passed to said load resistor, said inductor having a value selected to provide a high impedance at RF frequencies, said separating means further comprising a capacitor disposed between said attenuator and said RF load to block said attenuated average photodetector signal from passing to said RF load circuit, said capacitor having a capacitance selected to provide a high impedance at low frequencies and DC; and attenuator feedback control loop means for setting the attenuation provided by said attenuator so as to hold the average photodetector current through said load resistor constant, and thereby also holding the RF gain of said link substantially constant.

15. A fiber optic link comprising:

a source of input light modulated with an RF information signal;

a fiber optic (FO) waveguide means having a first end and a second end, wherein said modulated input light is injected into said first end and traverses said FO waveguide means to said second end;

photodetector means responsive to said light at said second end of said FO waveguide means to provide a photodetector current modulated by said information signal, said current characterized by an average photodetector current and an RF information signal component;

an RF load circuit, said RF load circuit characterized by a characteristic impedance; and an amplitude stabilization circuit, comprising:

a variable attenuator means for attenuating said photodetector current at an attenuation level determined by a signal received at a control port, said attenuator means characterized in that both said average photodetector current and said RF information signal component are attenuated equally;

a load resistor having a resistance value substantially equal to the magnitude of said characteristic impedance;

means for separating said average photodetector current and said RF information signal component so that only said information signal component is passed to said RF load circuit and only said average photodetector current is passed to said load resistor; and attenuator feedback control loop means for setting the attenuation provided by said attenuator so as to hold the average photodetector current through said load resistor constant, and thereby also holding the RF gain of said link substantially constant.

* * * * *